US010224219B2

(12) United States Patent
Andry et al.

(10) Patent No.: US 10,224,219 B2
(45) Date of Patent: Mar. 5, 2019

(54) HANDLER BONDING AND DEBONDING FOR SEMICONDUCTOR DIES

(71) Applicant: International Business Machines Corporation, Armonk, NY (US)

(72) Inventors: Paul S. Andry, Yorktown Heights, NY (US); Bing Dang, Chappaqua, NY (US); Jeffrey Donald Gelorme, Burlington, CT (US); Li-Wen Hung, Mahopac, NY (US); John U. Knickerbocker, Monroe, NY (US); Cornelia Tsang Yang, Medford, MA (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 14/983,674

(22) Filed: Dec. 30, 2015

(65) Prior Publication Data

US 2017/0194185 A1 Jul. 6, 2017

(51) Int. Cl.
*H01L 21/56* (2006.01)
*H01L 21/67* (2006.01)
*H01L 21/683* (2006.01)
*H01L 23/00* (2006.01)

(52) U.S. Cl.
CPC .......... *H01L 21/566* (2013.01); *H01L 21/568* (2013.01); *H01L 21/67092* (2013.01); *H01L 21/6835* (2013.01); *H01L 24/96* (2013.01); *H01L 2221/68318* (2013.01); *H01L 2221/68327* (2013.01); *H01L 2221/68381* (2013.01); *H01L 2224/04105* (2013.01); *H01L 2224/12105* (2013.01); *H01L 2224/73267* (2013.01)

(58) Field of Classification Search
CPC combination set(s) only.
See application file for complete search history.

(56) References Cited

U.S. PATENT DOCUMENTS

| 9,023,249 | B2 | 5/2015 | Fathi et al. |
|---|---|---|---|
| 9,029,238 | B2 | 5/2015 | Andry et al. |
| 9,111,983 | B1 | 8/2015 | Ginter et al. |
| 2005/0224472 | A1 | 10/2005 | Rasmussen et al. |
| 2014/0106473 | A1* | 4/2014 | Andry ................ H01L 21/6835 438/4 |

(Continued)

OTHER PUBLICATIONS

Andry, P., et al., "Advanced Wafer Bonding and Laser Debonding", 2014 IEEE Electronic Components & Technology Conference, May 27-30, 2014, pp. 1-5.

(Continued)

*Primary Examiner* — Ratisha Mehta
(74) *Attorney, Agent, or Firm* — Fleit Gibbons Gutman Bongini Bianco PL; Thomas S. Grzesik

(57) ABSTRACT

Various embodiments process semiconductor devices. In one embodiment, a release layer is applied to a handler. The at least one singulated semiconductor device is bonded to the handler. The at least one singulated semiconductor device is packaged while it is bonded to the handler. The release layer is ablated by irradiating the release layer through the handler with a laser. The at least one singulated semiconductor device is removed from the transparent handler after the release layer has been ablated.

14 Claims, 6 Drawing Sheets

(56) References Cited

U.S. PATENT DOCUMENTS

2014/0144593 A1  5/2014  Dang et al.
2015/0035554 A1  2/2015  Dang et al.

OTHER PUBLICATIONS

Dang, B., et al., "CMOS Compatible Thin Wafer Processing Using Temporary Mechanical Wafer, Adhesive and Laser Release of Thin Chips/Wafers for 3D Integration", 2010 Electronic Components and Technology Conference, Jun. 2010, pp. 1-6.
Fuller, M.J., et al., "Ultrafast Photoinduced Charge Separation Resulting from Self-assembly of a Green Perylene-based Dye into $\pi$-Stacked Arrays", Jan. 21, 2005, vol. 109, No. 6, pp. 1-6.
Latt, S., et al., "Spectral Studies on 33258 Hoechst and Related Bisbenzimidazole Dyes Useful for Fluorescent Detection of Deoxyribonucleic Acid Synthesis", The Journal of Histochemistry and Cytochemistry, Jan. 1976, vol. 24, No. 1, pp. 1-10.
Cameron, C., "Enhanced Rates of Electron Transport in Conjugated-Redox Polymer Hybrids", Apr. 2000, pp. 1-3.
Venkateswarlu, Y., et al., "Facile and Efficient One-Pot Synthesis of Benzimidazoles Using Lanthanum Chloride", Organic and Medicinal Chemistry Letters, Aug. 6, 2013, pp. 1-8.
List of IBM Patents or Applications Treated as Related.

\* cited by examiner

HANDLER BONDING AND DEBONDING FOR SEMICONDUCTOR DIES

BACKGROUND OF THE INVENTION

The present disclosure generally relates to the field of handler debonding, and more particularly relates to advanced methods for handler debonding.

Temporary wafer bonding/debonding is an important technology for processing semiconductor devices in general. Bonding is the act of attaching a semiconductor device wafer or singulated, which is to become a layer in a 3D stack, to a substrate or handling wafer so that it can be processed, for example, with wiring, pads, and joining metallurgy. Debonding is the act of removing the processed semiconductor device wafer or singulated from the substrate or handling wafer.

SUMMARY OF THE INVENTION

In one embodiment, a method for processing semiconductor devices is disclosed. The method comprises applying a release layer. The at least one singulated semiconductor device is bonded to the handler. The at least one singulated semiconductor device is packaged while it is bonded to the handler. The release layer is ablated by irradiating the release layer through the handler with a laser. The at least one singulated semiconductor device is removed from the transparent handler after the release layer has been ablated.

In another embodiment, a method for processing semiconductor devices is disclosed. The method comprises applying a release layer. Semiconductor packaging components are then built on the release layer. At least one singulated semiconductor device is bonded to the semiconductor packaging components. The release layer is ablated by irradiating the release layer through the handler with a laser. The at least one singulated semiconductor device is removed from the transparent handler after the release layer has been ablated.

In a further embodiment, a bonded semiconductor package is disclosed. The bonded semiconductor package comprises a handler and at least one packaged semiconductor device bonded to the transparent handler. The bonded semiconductor package further comprises a release layer, vulnerable to ablation by laser radiation, provided directly on the transparent handler, between the transparent handler and the at least one packaged semiconductor device.

In yet another embodiment, a system for processing semiconductor devices is disclosed. The system comprises memory and at least one processor operatively coupled to the memory. At least one control unit is operatively coupled to the memory and the at least one processor. The control unit operates at least one semiconductor device processing component of the system to apply a release layer to a handler. The at least one singulated semiconductor device is bonded to the handler. The at least one singulated semiconductor device is packaged while it is bonded to the handler. The release layer is ablated by irradiating the release layer through the handler with a laser. The at least one singulated semiconductor device is removed from the transparent handler after the release layer has been ablated.

In another embodiment, a computer program product for controlling processing of semiconductor devices is disclosed. The computer program product comprises a storage medium readable by at least one processing circuit and storing instructions for execution by the at least one processing circuit for performing a method. The method comprises applying a release layer. The at least one singulated semiconductor device is bonded to the handler. The at least one singulated semiconductor device is packaged while it is bonded to the handler. The release layer is ablated by irradiating the release layer through the handler with a laser. The at least one singulated semiconductor device is removed from the transparent handler after the release layer has been ablated.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
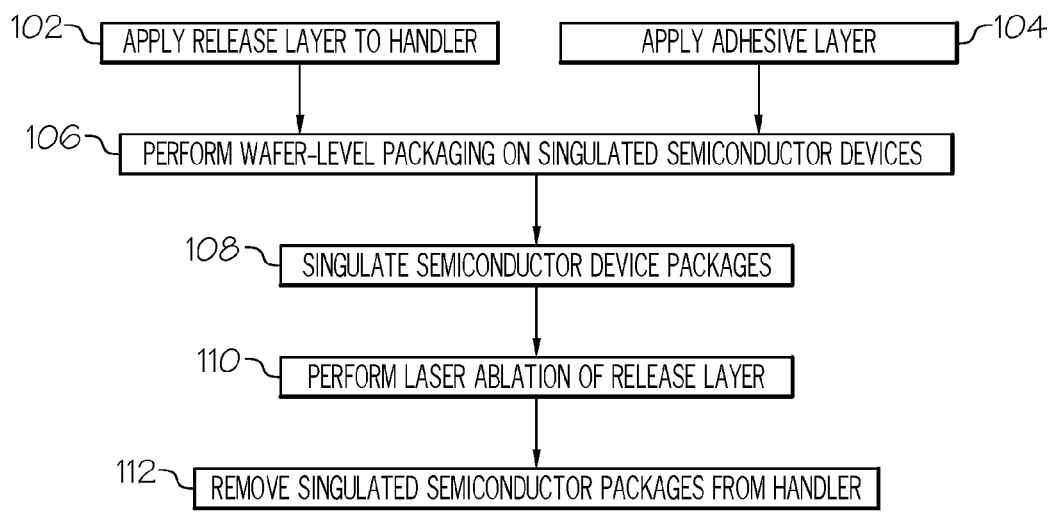
FIG. 1 is an operational flow diagram illustrating one example of bonding and debonding singulated semiconductor devices according one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

One or more embodiments provide various approaches for the temporary bonding and debonding of semiconductor device packages to a handling wafer or other substrate that utilize a distinct release layer and an optional adhesive layer. The release layer can be transparent. Debonding, in one embodiment, is performed by ablating the release layer using a laser. The laser used can be an ultraviolet (UV) laser (e.g., 355 nm laser), an alternate wavelength laser such as but not limited to 266 nm, 308 nm, 532 nm wavelength laser, or an infrared (IR) laser (e.g., wavelength of 1 um to 5 um or alternate high wavelength laser).

The release layer can be a UV or an IR ablation layer and it may be applied to the handling wafer, which may be a glass handler. The ablation layer is then cured. The bonding adhesive that forms the optional adhesive layer is then applied to either the handler or the semiconductor die. The ablation layer includes a material that is highly absorbing at the wavelength of the laser used in debonding. Both the ablation layer as well as the optional bonding adhesive are chemically and thermally stable so that they can fully withstand semiconductor packaging processes.

One example of a glass preparation process can begin with the ablation material being applied e.g. by spin coating onto the handler. The handler with the ablation material (which may also act as an adhesive layer) spin-coated thereon is then soft-baked to remove any solvent. Spin coating parameters depend on the viscosity of the ablation layer, but can fall in the range from approximately 500 rpm to approximately 3000 rpm. The soft-bake can fall in the range from approximately 80° C. to approximately 120° C. The temperature of the final cure can fall in the range from 200° C. to 400° C. For strongly UV-absorbing or UV-sensitive materials, very thin final layers on the order of approximately 1000 Å to approximately 2000 Å thick may be sufficient to act as release layers. The ablation layer can be fully and cleanly ablated using common UV (or IR) laser sources such as an excimer laser operating at 306 nm (e.g. XeCl) or 351 nm (e.g. XeF) or a diode-pumped tripled YAG laser operating at 355 nm.

The optional bonding layer adhesive can be any temporary or permanent adhesive desired. The bonding adhesive can be applied to either the handler (e.g., after the ablation layer is added) or to the die to be packaged. Because the ablation layer controls the handler release, the adhesive can be chosen irrespective of its UV or IR absorption characteristics. The adhesive chosen can be spin applied at approximately 500 to approximately 3000 rpm, soft-baked at between approximately 80° C. and approximately 120° C. and then cured at between approximately 300° C. and approximately 350° C. for up to an hour in nitrogen.

Laser debonding to release the handler at the ablation later interface can be performed using any one of a number of UV or IR laser sources including excimer lasers operating at 306 nm (e.g. XeCl) or 351 nm (e.g. XeF) as well as diode-pumped (tripled) YAG laser operating at 355 nm or diode-pumped (quadrupled) YAG laser operating at 266 nm. Laser sources operating at other wavelengths are applicable as well. Excimer lasers may be more expensive, may require more maintenance/support systems (e.g. toxic gas containment) and may have generally have very large output powers at low repetition rates (e.g. hundreds of Watts output at several hundred Hz repetition). UV ablation thresholds in the materials specified here may require 100-150 milliJoules per square cm (mJ/sqcm) to effect release. Due to their large output powers, excimer lasers can supply this energy in a relatively large area beam having dimensions on the order of tens of $mm^2$ area (e.g. 0.5 mm×50 mm line beam shape). Due to their large output power and relatively low repetition rate, a laser debonding tool which employs an excimer laser can comprise of a movable x-y stage with a fixed beam. Stage movement may be on the order of 10 to 50 mm per second. The wafer pair to be debonded may be placed on the stage, and scanned back and forth until the entire surface had been irradiated.

An alternative laser debonding system can be created using a less expensive, more robust and lower power solid-state pumped tripled YAG laser at 355 nm by rapidly scanning a small spot beam across the wafer surface. The 355 nm wavelength laser may compare favorably to the quadrupled YAG laser at 266 nm for two reasons: 1) Output powers at 355 nm are typically 2 to 3 times larger than at 266 nm for the same sized diode laser pump power, and 2) many common handler wafer glasses (e.g. Schott Borofloat 33) are approximately 90% or more transmissive at 355 nm but only about 15% transmissive at 266 nm. Since 80% of the power is absorbed in the glass at 266 nm, starting laser powers may be approximately 6× higher to achieve the same ablation fluence at the release interface, and there is risk of thermal shock in the handler itself.

An exemplary 355 nm scanning laser debonding system can include the following: 1) a Q-switched tripled YAG laser with an output power of 5 to 10 Watts at 355 nm, with a repetition rate between 50 and 100 kHz, and pulsewidth of between 10 and 20 ns. The output beam of this laser can be expanded and directed into a commercial 2-axis scanner, comprising mirrors mounted to x and y galvanometer scan motors. The scanner may be mounted a fixed distance above a fixed wafer stage, where the distance would range from 20 cm to 100 cm depending on the working area of the wafer to be released. A distance of 50 to 100 cm may effectively achieve a moving spot speed on the order of 10 meters/second. An F-theta lens may be mounted at the downward facing output of the scanner, and the beam may be focused to spot size on the order of 100 to 500 microns. For a 6 watt output power laser at 355 nm, at 50 kHz repetition and 12 ns pulsewidth, a scanner to wafer distance of 80 cm operating at a raster speed of 10 m/s, the optimal spot size may be on the order of 200 microns, and the required ~100 mJ/sq. cm ablation fluence may be delivered to the entire package surface twice in approximately 30 seconds (for example, using overlapping rows). The use of overlapping rows where the overlap step distance equals half the spot diameter (e.g., 100 microns) ensures that no part of the wafer is missed due to gaps between scanned rows, and that all parts of the interface see the same total fluence.

FIG. 1 is a flow chart illustrating one embodiment for performing handler bonding and debonding. A release layer is applied to a handler, at step 102. In another embodiment, an optional adhesive layer is also applied, at step 104. The optional adhesive layer can be, for example, an ultraviolet (UV) curable adhesive. The release layer may be applied to the handler while the adhesive layer may be applied to a dielectric layer onto which singulated semiconductor devices (also referred to herein as a "dies") are to be disposed. However, according to other embodiments, the release layer may be applied to the handler and then the adhesive layer may be applied to the release layer. In yet another embodiment, the adhesive can be applied directly to a surface of the singulated semiconductor devices. The handler, in one embodiment, is a handle wafer, handle panel, handle roll such as that utilized in roll-to-roll level processing, and/or the like. Example dimensions of wafer level "handle wafers" may be approximately 200 mm diameter or 300 mm diameter and be approximately from 500 um to 800 um thickness. Example panel size form factors may mimic the flat panel sizes for panel fabrication which can be from less than about 350 mm×450 mm square to sizes that exceed 1200 mm square. Example roll to roll sizes may be of 25 um to over 100 um thickness for glass with a width of from less than 50 mm to over 1200 mm wide and in lengths up to over 300 m. Alternatively, other materials compatible with processing may also be used such as composite of glass and polymer, ceramic (Sapphire, SiC) or polymer material may be used to support fabrication of some integrated packages, sub components or structures.

Thereafter, wafer-level packaging is performed to package singulated semiconductor devices, at step 106. Singulated semiconductor devices are semiconductor devices that have been previously fabricated (e.g., front-end-of-line processing, gate oxide and implants, back-end-of-the-line processing, metal layers, interconnects, etc.) on a device wafer and cut into individual dies as a result of a semiconductor-die cutting process. The device wafer, in one embodiment, is thinned prior to die cutting resulting in dies ranging from full thickness wafers of about 780 um to 730 um for 300 mm and 200 mm wafers, respectively down to sub 1 um thick silicon with Front and Back end of Line (FEOL and BEOL) wiring and dielectrics that can permit thickness of approximately <10 um to 150 um thickness in applications. One example of thickness ranges for die applications can be in the 30 um to 60 um thickness. Note this technology also lends itself to package integration and die integration as well as package and multi-die (adjacent and/or stacked) type applications.

The singulated semiconductor devices can be packaged using a die-first or a die-last process. In a die-first process, the dies are first coupled to the handler face-down. A mold compound is deposited to combine the dies to wafer format in an overmold or compression mold application technique or alternate technique. It should be noted that the dies can be disposed directly on the release layer (or adhesive) or on an insulating layer, such as a dielectric layer formed on the release layer (or adhesive layer). Interconnections, redistribution layer (RDL) and bumping processes are then performed. In a die-last process, package backside metallizations with or without bumps are created, dielectric or an insulating layer is deposited along with one or more electrical interconnection vias per layer and one or more wiring layers/via layers along with corresponding dielectric insulating layer or layers along with a top dielectric layer and electrical interconnections, are formed on the release layer (or adhesive layer). These redistribution layers (RDL) layers may be fan-out, fan-in, or both dependent on application. The above processes are performed to build-up one or more wiring levels. In one embodiment, a molding process can be performed once the wiring levels have been built-up and die(s) has been attached. In this process, the dies bonded to the wiring structure and then an underfill and/or over molding process may be performed. It should be noted that embodiments of the present disclosure are applicable to any alternative structure and packaging build technique for wafer level or multi-component packaging of multiple singulated semiconductor devices on the handler wafer, panel or roll to roll process Once the semiconductor devices have been packaged, a singulation process is performed to singulate the packages, at step 108. A laser ablation process is performed to sever the packages from the handler, at step 110. Laser ablation, in one embodiment, is performed by exposing the release layer to UV laser light through the transparent handler. Upon exposure to the UV laser light, the release layer be ablated, may burn, break down, or otherwise decompose. Thus, the release layer according one or more embodiments comprises a material that is broken down under the exposure of the UV or IR laser light. As any applied adhesive layer (if utilized) remains hard during this process, the packages, along with the adhesive layer, can be easily removed from the handler. Where desired, the remainder of the adhesive layer can be removed from the packages using various processing techniques such as chemical cleaning, plasma ashing and/or alternate techniques. After the laser ablation has resulted in the severing of the packages from the handler, the packages can be easily removed from the handler, for example, by simply pulling the handler away, vacuum pick up fixture or tool, and the packages can be cleaned to remove the adhesive, at step 112. The adhesive can chemically removed, plasma ashed for removal and/or mechanically removed subsequent to laser ablation of the release layer. The adhesive can also be removed by chemical cleaning and/or plasma/ashing processes as well.

Figure 2:
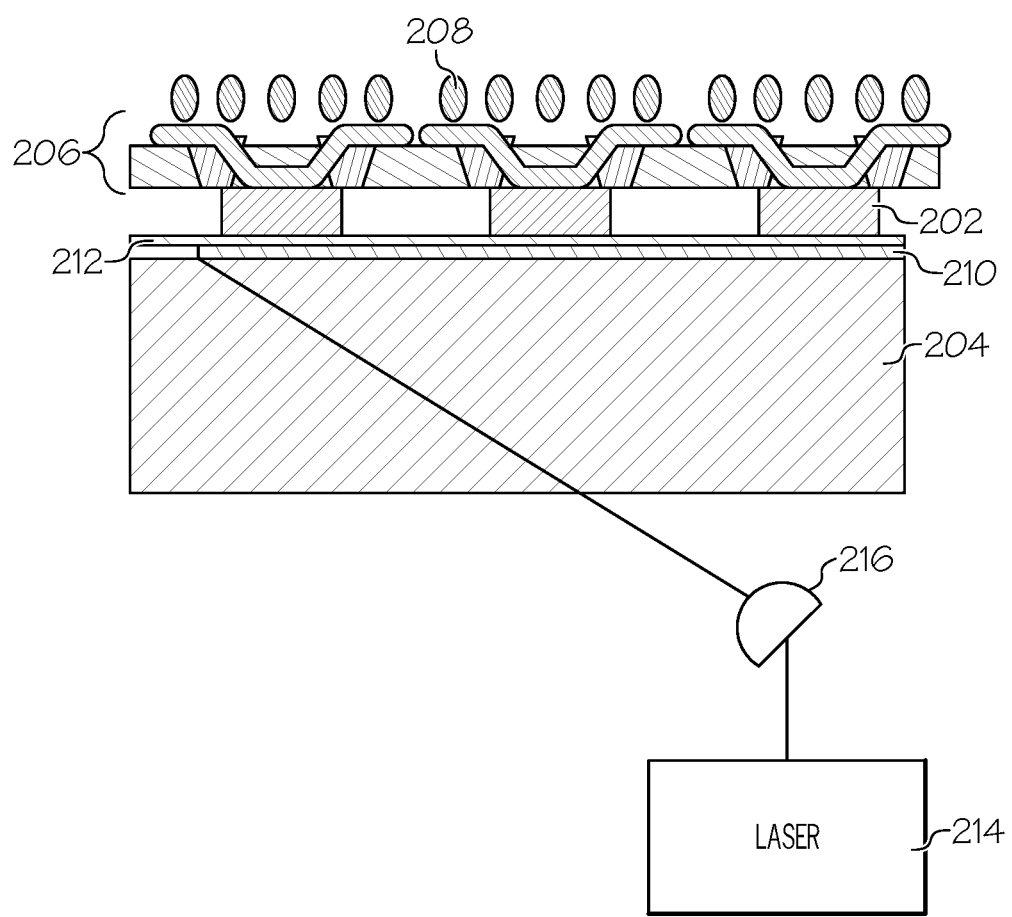
FIG. 2 is a schematic diagram illustrating bonding and debonding of a singulated semiconductor device to a handler utilizing a die-first process according one embodiment of the present disclosure.
Figure 3:
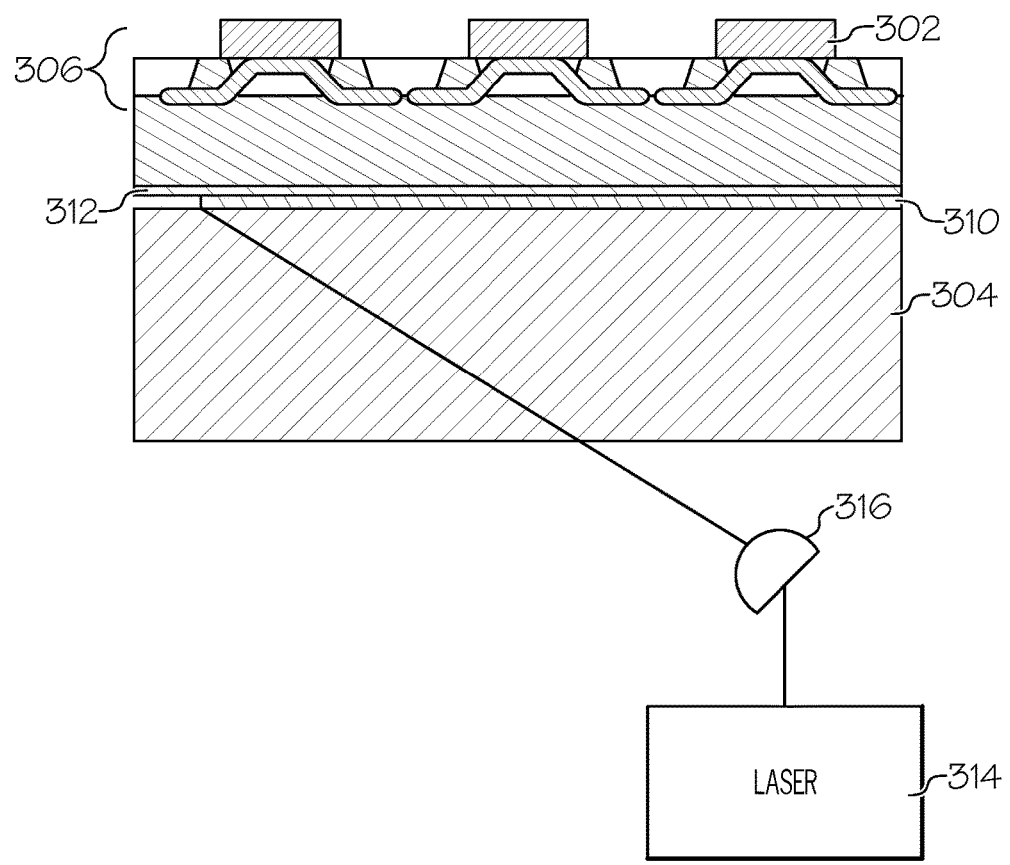
FIG. 3 is a schematic diagram illustrating bonding and debonding of a singulated semiconductor device to a handler utilizing a die-last process according one embodiment of the present disclosure.

FIGS. 2 and 3 are schematic diagrams illustrating bonding and debonding of a package to a handler in accordance with one or more embodiments. FIG. 2 shows that dies 202 have been bonded to a handle 204 utilizing a die-first process, whereas FIG. 3 shows that dies 302 have been bonded to a handle 304 utilizing a die-last process. In FIG. 2, a die 202 is bonded to the handler 302 to provide structural support thereto during packaging processes. The die 202 comprises a semiconductor substrate comprising silicon or other semiconductor materials and can be covered by an insulating layer. The die 202 can comprise conductive layers or semiconductor elements, such as transistors, capacitors, diodes, inductors, resistors, etc. FIG. 2 further shows that various packaging components are built-up from the die 202. For example, one or more wiring levels 206, solder bumps 208, molding compounds (not shown), through-vias (not shown), and/or the like are built up from the die 202. An insulating layer (not shown) can also be disposed between the handle 204 and the die 202.

In FIG. 3, various packaging components are built-up from the handler 304 to provide structural support thereto. For example, one or more insulating layers 305, wiring levels 306, molding compounds (not shown), through-vias (not shown), and/or the like are built up from the handler 304. The die 302 is then bonded to the various wiring levels 306. Similar to the die 202 of FIG. 2, the die 302 in FIG. 3 comprises a semiconductor substrate comprising silicon or other semiconductor materials and can be covered by an insulating layer. The die 302 can comprise conductive layers or semiconductor elements, such as transistors, capacitors, diodes, inductors, resistors, etc. It should be noted that the packaging components shown in FIGS. 2 and 3 are known to those of ordinary skill in the art and any die-first and die-last packaging processes (and components) are applicable to embodiments of the present disclosure.

The handler 204, 304, in one embodiment, is a transparent substrate and may comprise, for example, Borofloat glass. The handler may be sufficiently thick to provide structural integrity to the packaging components bonded thereto. For example, the handler 302, 304 can be approximately 650 μm thick. As described above, a release layer 210, 310 and optional adhesive layer 212, 312 can be provided between the singulated dies 202 and handler 204, as shown in FIG. 2, or between an insulating layer 305 and the handler 304, as shown in FIG. 3.

According to one embodiment, the release layer 210, 310 is disposed directly upon the handler 204, 304. The release layer 210, 310 can be generated, for example, by spin coating or spraying the release layer material, for example, onto the handler 204, 304, and then curing the material using heat and/or UV light. Curing of the release layer material may either be performed prior to bonding of the handler 204, 304 to the die 202, 302 or packaging components, such as the insulating layer 305, or at the same time.

The release layer 210, 310, in one embodiment, comprises a material that is highly specialized to absorb strongly near the UV wavelength of laser light used during laser ablation. For example, in one embodiment, a UV laser at or near the wavelength 355 nm can be employed. In this embodiment, the release layer 210, 310 comprises a solid state material that is highly absorbent of UV light, and in particular, light having a 355 nm wavelength. This material is strong enough to withstand commonly used packaging techniques while components are bonded to the handler 204, 304 without the release layer 210, 310 prematurely breaking down. In other embodiments, the release layer 210, 310 has infrared (IR) wavelength absorption such that the release layer 210, 310 is ablated when passing IR energy through the handler 204, 304 (e.g., silicon handler) such as at 1064 nm, or at wavelength of compatible with transmission through the handler such as but not limited to 1,800 to 5000 nm or higher.

The release layer 210, 310 may itself comprise an adhesive or be an entirely distinct layer from the optional adhesive layer 212, 312. The release layer 210, 310 can comprise a single layer of materials and/or one or more added layers of the same or alternate composition to provide for fill of non planar structures, for accommodation around features such as solder bumps, copper pillars, thinned die, electronic or optical components or other structures desired in the product or to aide processing. In some embodiments, absorption material(s) are added to the release layer 210, 310 and are matched to the desired debonding laser wavelength, where the use temperature and release parametrics do not degrade the dye absorption properties so as to make the release layer not release from the handler. Examples of absorption materials are dyes that can be added to the release layer 210, 310. The addition of a dye(s) to the release layer adjust the release layer material to have high absorption for one or more functions such as absorption of layer wavelength for ablation (such as 306 nm, 308 nm, 355 nm, 532 nm, 266 nm, 1064 nm, 16000 nm to 2000 nm 2100 nm to 2700 nm or alternate wavelength for laser ablation of the release layer) and for machine detection for notch finding in glass such as 670 nm or alternate wavelength compatible with equipment.

Further examples, of dye/additive materials include, but not are limited to, various bis-benzimidazoles molecules as outlined in the article: 'Spectral studies on Hoechst 33258 and related bisbenzimadazole dyes useful for fluorescent detection of deoxyriboucleic acid synthesis'. The Journal of Histochemistry and Cytochemistry. S. A. Latt and G. Stetten, V 24. Number 1, pp 23-33, 1976, which is hereby incorporated by references in its entirety. Other examples of dye materials include particles such as carbon black, titanium dioxide, and various dyes as noted in 'Near IR absorbing Dyes'. Juergen Fabian, et. Chem Rev. 1992, 92, 1197-1226, which is hereby incorporated by reference in its entirety.

In one or more embodiments, electromagnetic (EM) energy may be absorbed in part or completely from the addition of additives to the base release layer 210, 310 that is tied to the chemistry of the release material and can withstand higher temperatures than dye material additives, dye, or other additives and/or from the release base composition. For example, materials that can be covalently linked or bonded to the base polymer release layer 210, 310 using of a chemical reaction can be utilized. Examples include molecules such as pyrene carboxylic acid or fluorescein derivatives that have been chemically attached to Dextran through esterification reactions between the carboxylic acid of the dye and any dextran hydroxy group. These materials may or may not be thermally stable. Once example of a thermally stable covalently attached dye to the release layer is the reaction of Anthraquinone-2-carboxylic acid to a phenoxy resin.

In addition, the release layer structure 210, 310 can also include the same or another EM absorbing additive that supports wafer handling or processing such as 670 nm for wafer notch detection or other targeted EM absorbing materials for other desired processing, equipment or product benefit. Examples of 670 nm additive materials include the dye VIS 661 from QCR corporation. 'Zerox Green' phthalocyanne dye, or the Bay substituted perylene bis-imide dyes as described in the publication: Ultrafast Photoinduced Charge separation resulting from self Assembly of a green perylene based into pie-stacked arrays', J Phys Chem A, 2005, 109, 970-975, which is hereby incorporated by reference in its entirety. Other examples of 670 nm additives include vanadyl phthlaocyanine, carbon black, copper phthalocyanine, vanadyl, phthalocyanine, anthraquinone, anthraquinone functionalized polymer, a combination of the above, and/or the like. In some embodiments, the EM absorber added to the release layer structure 210, 310 allows for infrared (IR) release such for laser wavelengths of 1 um to 5 um or higher. It should be noted that the added layers do not require adsorption material for the release wavelength of the targeted laser debonding.

Regardless of the material used, the release layer 210, 310 comprises a material(s) that can be laser ablated at the UV or IR wavelength of choice to release the handler 204, 304 from a wafer level package. In other words, the targeted absorption material is matched to the desired debonding laser wavelength. The optional adhesive layer 212, 312 can be created by applying an adhesive material to either the die 202 or to the release layer 204, 304. The adhesive layer 212, 312 comprises a distinct material from that which is used as the release layer 212, 312, and in particular, the adhesive layer 212, 312 may be an adhesive that does not strongly absorb the light of the wavelength that is used to ablate the release layer 210, 310. While any number of suitable adhesives can be used for this layer, one example of a suitable adhesive is TOK A0206. The adhesive layer can be created, for example, by applying the adhesive material to the die 202 or to the release layer 210, 310 and cured using heat.

In one or more embodiments, the release layer 210, 310 is cured prior to performing bonding. In this way, potential adverse interaction between the release layer 210, 310 material and the optional adhesive layer 212, 312, material can be minimized. Bonding can be performed in a bonder, for example, a Suss bonder using approximately 500 mbar of applied force in a temperature corresponding to the temperature of the adhesive layer 212, 312 material. In bonding, die 202 may be bonded to the handler 204 via the release layer 210 or optional adhesive layer 212.

After the dies 202, 302 have been packaged and the packages singulated, a laser 214, 314 is used to irradiate the release layer 210, 310. As discussed above, the laser can have a wavelength between 300 nm and 5000 nm. However, other wavelengths are applicable as well. For example, the laser 214, 314 can be a 306 nm excimer laser or a 355 nm DPSS laser created by frequency tripling a diode-laser at 1064 nm. According to one example, the laser 214, 314 can be a HIPPO 355QW laser with a wavelength of 355 nm, a power of 5 W at 50 kHz, a repetition rate of 15-300 kHz, and a pulse width of less than 12 ns at 50 kHz. However, other UV lasers may be used such as a HIPPO 266QW having a 266 nm wavelength. In another example, the laser 214, 314 is an IR laser.

Figure 4A:
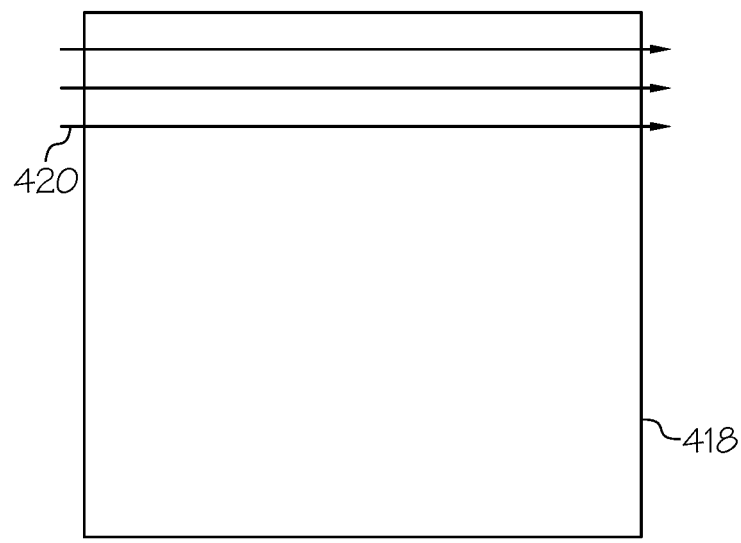
FIGS. 4A and 4B are schematic diagrams illustrating patterns of applying the laser light to a top surface of the handler according one embodiment of the present disclosure.
Figure 4B:
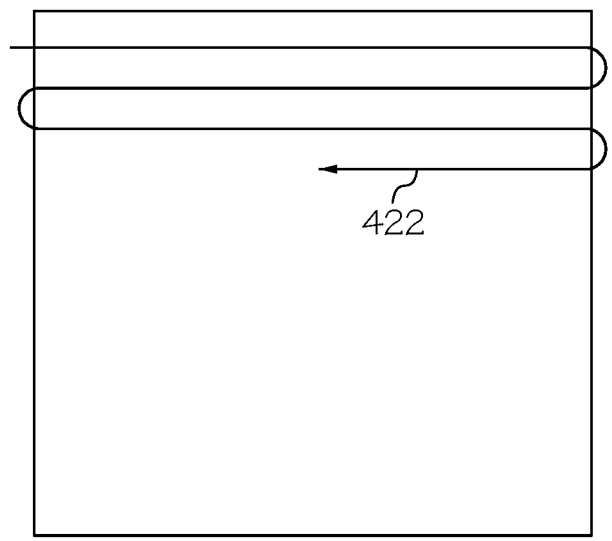

The release layer 210, 310 is irradiated though the handler 204, 304, which may be transparent, at least to the wavelength of the laser 214, 314 used. The laser 214, 314 can produce a spot beam that is scanned across the surface of the handler 204, 304, for example, in a raster pattern, or the laser 214, 314 can produce a fan beam that is swept once or multiple times across the handler 204, 304. Directing of the light radiated from the laser 214, 314 can be handled by the use of a seamier and lens 216, 316, which may be, for example, an F-Theta scan lens having an 810 mm fl. FIG. 4 is a schematic diagram illustrating pattern of applying the laser light to a top surface 418 of the handler 404 in accordance with one or more embodiments. As seen in FIG. 4A, the laser light can be directed across the top surface 418 of the handler 404 as a spot beam drawn to lines 420, which move along an x-axis direction of the top surface 418 of the handler 404 with each successive line 420 being drawn lower in the y-axis direction. Alternatively, as seen in FIG. 4B, the laser light can be directed in a serpentine pattern 422.

As the UV or IR wavelength of the laser 214, 314 used may comprise relatively high energy, the light may efficiently ablate the release layer 210, 310. Once ablated, the singulated packages can be freely removed from the handler layer 204, 304. Thereafter, a solvent or cleaning chemical can be used to remove any remaining elements of the optional adhesive layer 212, 312 and/or release layer 210, 310 that may remain on the packages.

Figure 5:
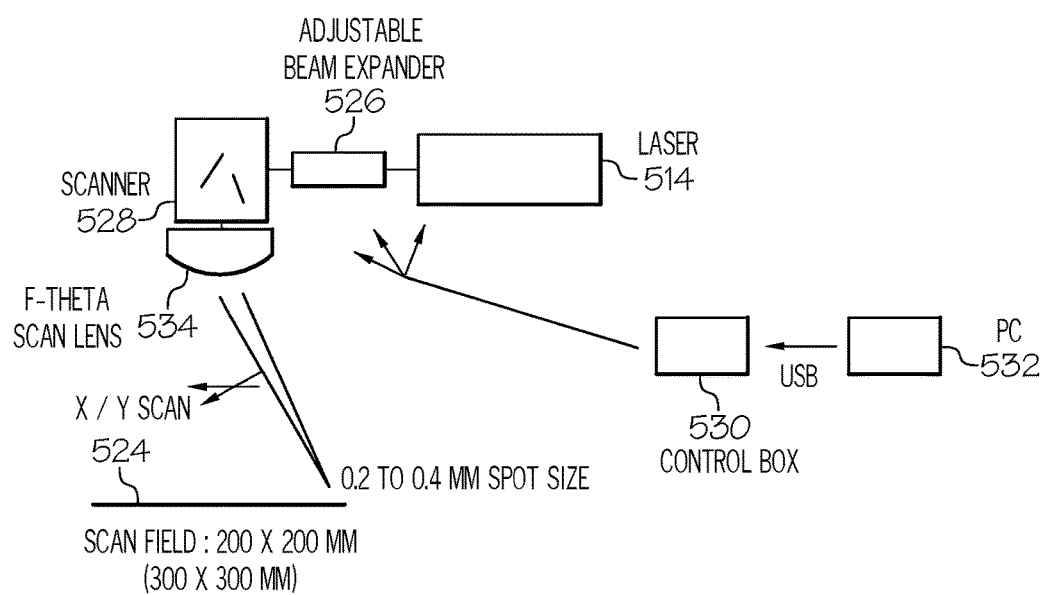
FIG. 5 is a schematic diagram illustrating a scanning laser debonding system according one embodiment of the present disclosure.

FIG. 5 is a schematic diagram illustrating an apparatus for performing laser debonding in accordance with one or more embodiments. According to some embodiments, such as is shown here in FIG. 5, the bonded handler and semiconductor packages 524 can remain stationary, for example, on a stage. According to other embodiments, the stage can be movable. The laser 514 provides a beam that is sent into a beam expander 526 to provide the desired beam size. The beam then enters a scanner 528 where the beam is directed along the x and y axes. One or more control units 530 affect control of the laser 514, beam expander 526 and the scanner 528. Where the stage upon which the bonded handler and packages 524 are held is movable, the controller 530 can control the movement of the stage as well. In such a case the scanner 528 is omitted. A computer system 532 can be preprogrammed with the manner of control and these instructions can be executed though the one or more control units 530. A scan lens 534 can adjust the beam so as to strike the bonded handler and packages 524 with the desired spot characteristics.

Figure 6:
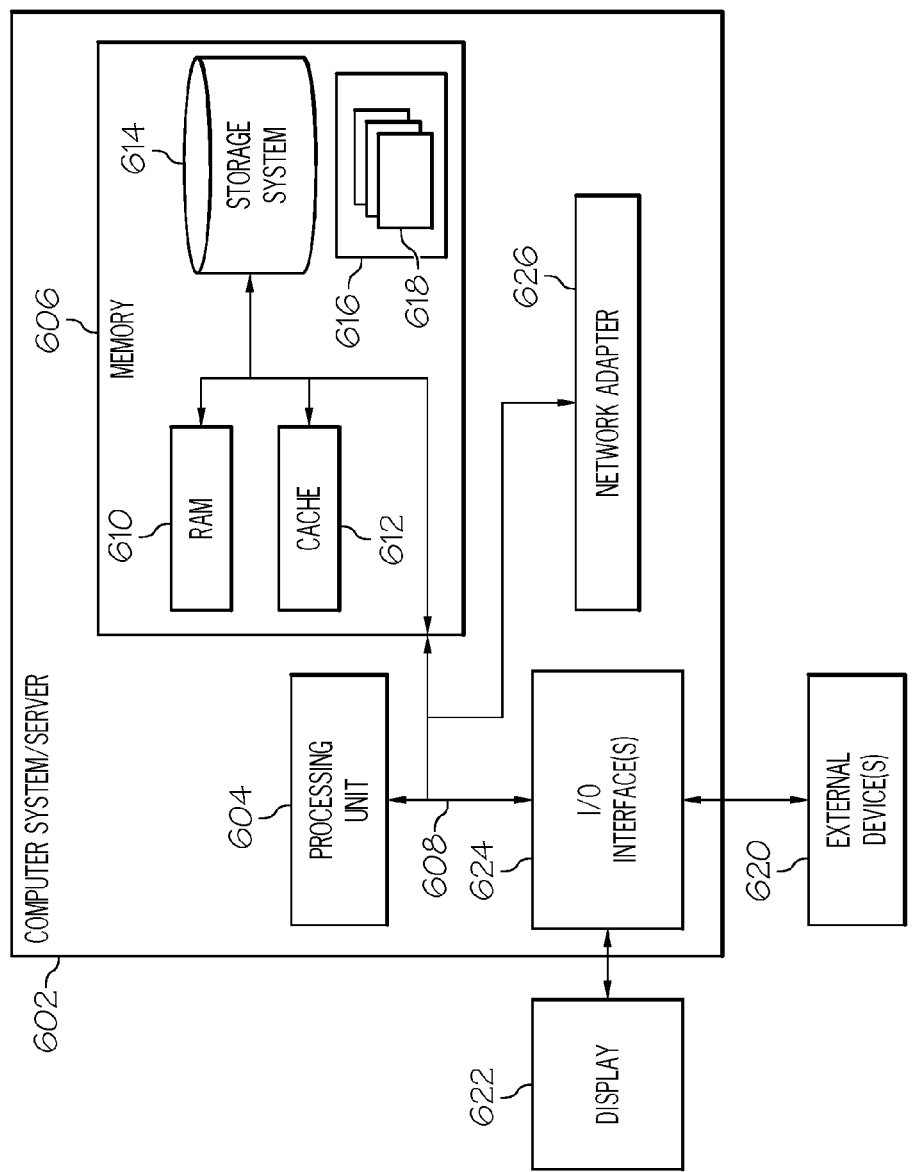
FIG. 6 is a block diagram illustrating one example of an information processing system according to one embodiment of the present disclosure.

Referring now to FIG. 6, this figure is a block diagram illustrating an information processing system 602 that can be utilized in embodiments of the present disclosure. For example, the information processing system 602, in one embodiment, controls one or more semiconductor device processing components for performing one more operations of the various embodiments of the present disclosure. The information processing system 602 is based upon a suitably configured processing system configured to implement one or more embodiments of the present disclosure. Any suitably configured processing system can be used as the information processing system 602 in embodiments of the present disclosure. The components of the information processing system 602 can include, but are not limited to, one or more processors or processing units 604, a system memory 606, and a bus 608 that couples various system components including the system memory 606 to the processor 604.

The bus 608 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Although not shown in FIG. 6, the main memory 606 includes one or more control units such as (but not limited to) control unit 530 that controls operating of one or more semiconductor device processing components. Alternatively, the control unit(s) reside within the processor 604, or is a separate hardware component. The system memory 606 can also include computer system readable media in the form of volatile memory, such as random access memory (RAM) 610 and/or cache memory 612. The information processing system 602 can further include other removable/non-removable, volatile/non-volatile computer system storage media. By way of example only, a storage system 614 can be provided for reading from and writing to a non-removable or removable, non-volatile media such as one or more solid state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 608 by one or more data media interfaces. The memory 606 can include at least one program product having a set of program modules that are configured to carry out the functions of an embodiment of the present disclosure.

Program/utility 616, having a set of program modules 618, may be stored in memory 606 by way of example, and not limitation, as well as an operating system, one or more application programs, other program modules, and program data. Each of the operating system, one or more application programs, other program modules, and program data or some combination thereof, may include an implementation of a networking environment. Program modules 618 generally carry out the functions and/or methodologies of embodiments of the present disclosure.

The information processing system 602 can also communicate with one or more external devices 620 such as a keyboard, a pointing device, a display 622, etc.; one or more devices that enable a user to interact with the information processing system 602; and/or any devices (e.g., network card, modem, etc.) that enable computer system/server 602 to communicate with one or more other computing devices. Such communication can occur via I/O interfaces 624. Still yet, the information processing system 602 can communicate with one or more networks such as a local area network (LAN), a general wide area network (WAN), and/or a public network (e.g., the Internet) via network adapter 626. As depicted, the network adapter 626 communicates with the other components of information processing system 602 via the bus 608. Other hardware and/or software components can also be used in conjunction with the information processing system 602. Examples include, but are not limited to: microcode, device drivers, redundant processing units, external disk drive arrays, RAID systems, tape drives, and data archival storage systems.

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit", "module", or "system."

Embodiments of the present disclosure may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer maybe connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for processing semiconductor devices, the method comprising:
   applying a release layer to a transparent handler;
   bonding at least one singulated semiconductor device to the transparent handler without applying a separate adhesive layer between the singulated semiconductor device and the transparent handler;
   packaging the at least one singulated semiconductor device while it is bonded to the transparent handler;
   ablating the release layer by irradiating the release layer through the transparent handler with a laser; and
   removing the at least one singulated semiconductor device from the transparent handler after the release layer has been ablated.

2. The method of claim 1, wherein the transparent handler is one of:
   a handle wafer;
   a panel; and
   a roll of handler material.

3. The method of claim 1, further comprising:
   forming a dielectric layer on the release layer prior to bonding the at least one singulated semiconductor device, wherein the dielectric layer is situated between the release layer and the at least one singulated semiconductor device.

4. The method of claim 1, wherein the release layer absorbs a frequency of light radiated from the laser.

5. The method of claim 1, wherein light radiated from the laser has a wavelength of approximately 250 nm to 5000 nm.

6. The method of claim 1, wherein the laser used for ablating the release layer is one of a YAG laser, a XeF excimer laser, and a diode-pumped solid-state (DPSS) laser.

7. The method of claim 1, wherein light radiated from the laser is ultraviolet light.

8. The method of claim 1, wherein light radiated from the laser is infrared light.

9. The method of claim 1, wherein the release layer is a single layer of material.

10. The method of claim 1, wherein the release layer comprises one or more additive materials, wherein the additive materials adjust a frequency of light absorption property of the release layer.

11. The method of claim 1, wherein the release layer is substantially transparent to visible light.

12. A computer program product for controlling processing of semiconductor devices, the computer program product comprising:
   A non-transitory storage medium readable by at least one processing circuit and storing instructions for execution by the at least one processing circuit for performing a method comprising:
      applying a release layer to a transparent handler;
      applying a distinct insulating layer to the release layer if a distinct adhesive layer has not been applied to the release layer at least one singulated semiconductor device, otherwise applying the insulating layer to the distinct adhesive layer;
      bonding the at least one singulated semiconductor device to the transparent handler, wherein the singulated semiconductor device is disposed directly on the insulating layer;
      packaging the at least one singulated semiconductor device while it is bonded to the transparent handler;
      ablating the release layer by irradiating the release layer through the transparent handler with a laser; and
      removing the at least one singulated semiconductor device from the transparent handler after the release layer has been ablated.

13. The computer program product of claim 12, wherein the method further comprises:
   applying an adhesive layer, that is distinct from the release layer, between the at least one singulated semiconductor device and the release layer.

14. The computer program product of claim 12, wherein the release layer comprises one or more additive materials, wherein the additive materials adjust a frequency of light absorption property of the release layer.

* * * * *